(12) United States Patent
Wyszynski

(10) Patent No.: US 6,917,252 B1
(45) Date of Patent: Jul. 12, 2005

(54) FULLY INTEGRATED AUTOMATICALLY-TUNED RF AND IF ACTIVE BANDPASS FILTERS

(76) Inventor: Adam S. Wyszynski, 1512 Highland Cir., Little Elm, TX (US) 75068-3787

( * ) Notice: Subject to any disclaimer, the term of this patent is extended or adjusted under 35 U.S.C. 154(b) by 0 days.

(21) Appl. No.: 10/423,923

(22) Filed: Apr. 28, 2003

(51) Int. Cl.$^7$ .............................................. H04B 3/04
(52) U.S. Cl. ...................... 333/17.1; 333/202; 455/339
(58) Field of Search ............................... 333/17.1, 202, 333/13, 14, 2, 3, 174; 375/235, 240, 254, 296, 298, 350; 455/313, 323, 326, 334, 338–341; 327/551–553

(56) References Cited

U.S. PATENT DOCUMENTS

| | | | |
|---|---|---|---|
| 3,997,856 A | | 12/1976 | Canning et al. |
| 4,438,529 A | | 3/1984 | Sato |
| 4,952,891 A | | 8/1990 | Moulding |
| 5,072,298 A | | 12/1991 | Sumiyoshi |
| 5,210,504 A | | 5/1993 | Yagita et al. |
| 5,303,228 A | * | 4/1994 | Tzeng ......................... 370/291 |
| 5,335,364 A | * | 8/1994 | Heinonen ..................... 455/76 |
| 5,345,119 A | | 9/1994 | Khoury |
| 5,440,264 A | | 8/1995 | Sevenhans et al. |
| 5,471,168 A | | 11/1995 | Sevenhans et al. |
| 5,608,665 A | | 3/1997 | Wyszynski |
| 5,737,035 A | | 4/1998 | Rotzoll |
| 5,812,612 A | * | 9/1998 | Saito .......................... 375/272 |
| 5,896,562 A | * | 4/1999 | Heinonen ..................... 455/76 |
| 5,912,583 A | | 6/1999 | Pierson et al. |
| 5,914,663 A | | 6/1999 | Whitehead |
| 5,930,686 A | * | 7/1999 | Devlin et al. .................. 455/84 |
| 5,994,951 A | * | 11/1999 | Mazhar et al. ............... 327/553 |
| 5,999,824 A | * | 12/1999 | Na ........................... 455/553.1 |
| 6,031,878 A | | 2/2000 | Tomasz et al. |
| 6,148,048 A | * | 11/2000 | Kerth et al. .................. 375/350 |
| 6,169,447 B1 | * | 1/2001 | Tolson ......................... 327/557 |
| 6,177,964 B1 | | 1/2001 | Birleson et al. |
| 6,285,865 B1 | | 9/2001 | Vorenkamp et al. |
| 6,310,512 B1 | * | 10/2001 | Briskin et al. ............... 327/552 |
| 6,356,736 B2 | | 3/2002 | Tomasz et al. |
| 6,374,086 B1 | * | 4/2002 | Tolson ......................... 455/73 |
| 6,377,315 B1 | | 4/2002 | Carr et al. |
| 6,400,932 B1 | * | 6/2002 | Oh et al. .................. 455/150.1 |
| 6,404,277 B1 | | 6/2002 | Lee et al. |
| 6,417,727 B1 | | 7/2002 | Davis |
| 6,496,230 B1 | | 12/2002 | Limberg et al. |

OTHER PUBLICATIONS

Y. Tsividis, "Self–Tune Filters," Electronic Letters, vol. 17 (No. 12), pp. 406–407, (Jun., 1981).
G.A. De Veirman & R. Yamasaki, "Fully–Integrated 5 to 15 MHz Programmable Bessel Lowpass Filter," Proc. IEEE Int. Symp. Circ. Syst., p. 1155–1158, (1990).
G.A. De Veirman & R. Yamasaki, "Monolithic 10–30 MHz Tunable Bipolar Bessel Lowpass Filter," Proc. IEEE Int. Symp. Circ. Syst., p. 1444–1447, (1991).
G.A. De Veirman & Yamasaki, "Design of Bipolar 10–MHz Programmable Continuous Time 0.05° Equiripple Linear Phase Filter," IEEE J. Solid–State Circuits, vol. 27 (No. 3), pp. 324–331, (1992).

* cited by examiner

Primary Examiner—Timothy P. Callahan
Assistant Examiner—Hai L. Nguyen
(74) Attorney, Agent, or Firm—Locke Liddell & Sapp LLP

(57) ABSTRACT

An automatic tuning scheme for two active band-pass filters where both filters operate on the signal while simultaneously being tuned using a reference signal. To allow that the amplitude of a reference signal is made small and since both filters demonstrate a good linearity the build-up of the inter-modulation distortion does not occur. The first band-pass filter is tuned with the reference falling into its passband. The second band-pass filter is also tuned with the reference placed into its pass-band. The reference is practically eliminated by the virtue of the complexity of the second band-pass filter. Assuming the filter passes the signal for positive frequencies if the reference is made a negative frequency by appropriate 90 degrees phase shifting it will be attenuated by at least 55 dB, which is a sufficient signal-to-reference ratio.

13 Claims, 8 Drawing Sheets

FULLY INTEGRATED AUTOMATICALLY-TUNED RF AND IF ACTIVE BANDPASS FILTERS

TECHNICAL FIELD OF THE INVENTION

The present invention relates to fully-integrated continuous-time active band-pass filters and their automatic frequency- and Q-tuning systems.

BACKGROUND OF THE INVENTION

Nearly all practical transceivers require some form of filtering. Up to the date, in majority of cases, these radio-frequency (RF) and intermediate-frequency (IF) filters are realized off-chip as ceramic or surface-acoustic wave (SAW) devices.

A first reason for slow progress in integration RF and IF filters is their rather modest noise and distortion performance. This can be alleviated by a careful overall system design by taking into account the filter short comings and by purposely reducing their requirements while simultaneously offsetting their reduced performance with superior performance of preceding and following high-quality blocks.

A second reason for slow progress in integration RF and IF filters is that these filters require circuitry for adjusting their center or corner frequency as well as their quality-, or (Q)-factors. The accuracy problems of such tuning systems may result in the whole filter not meeting the stringent system specifications over process, voltage supply and temperature variation (PVT). Due to the matching errors the most frequently used Master-Salve (M-S) schemes suffer from significant accuracy errors averaging up to 5% for frequency schemes and up to several tens of percent for Q-tuning schemes. Naturally, for majority radio applications such a modest accuracy is not acceptable. Additionally, the reference feed-through degrades the overall noise performance of the filter. The typically achievable S/N ratio of an active filter tuned with a M-S scheme is about 40 dB.

A third reason for slow progress in integration RF and IF filters is not taking full advantage of possible system and circuit trade-offs during the transceiver design. In order to make a design of RF or IF filters viable, their system specification should be optimized and carefully negotiated with the overall system specifications. In other words, for a successful implementation of a fully-integrated transceiver the sequence of specification building should be reversed: knowing the limitations of the active filters one should design the system architecture, its system specifications and other circuits to alleviate these shortcomings. Only then the whole system has a chance to meet its overall requirements.

In the case of the presented RF and IF filters the tuning accuracy can be substantially improved with tuning the filter signal directly instead of using the Master-Slave (M-S) scheme by passing the reference through it while simultaneously processing the signal. The expected accuracy of such frequency- and Q-tuning systems could reach 0.5% and 2% respectively. There are certain requirements for the reference signal that need to be fulfilled:

its frequency should fall at the edge of the pass-band of the RF filter, but its frequency should be chosen so that it will not inter-modulate with the adjacent channel carrier;

the reference amplitude of the RF filter should be at least 15 dB lower than the selected channel carrier;

given these conditions the reference passes the RF band-pass (BP) filter linearly with causing inter-modulation distortion. Suppose that the reference frequency it is Δf away from the desired channel carrier. Give the attenuation characteristic of the IF BP filter Δf separation should be chosen such that the IF BP filter attenuates the reference of the RF BP filter by at least 40 dB;

hence at the output the signal and the reference differ at least by 55 dB, which is better than the reference feed-through of a typical M-S scheme;

the reference of the IF BP filter is rejected by its appropriate conditioning with respect to the main signal and the complex nature of the IF BP filter. The expected attenuation of the IF BP filter reference is at least 55 dB.

DESCRIPTION OF THE PRIOR ART

The architecture of a classical Master-Slave (M-S) tuning scheme such as one described in U.S. Pat. No. 3,997,856 is illustrated in FIG. 1, and is identified by the numeral 10. Note that only a frequency-tuning scheme is presented in U.S. Pat. No. 3,997,856. The Q-tuning scheme is not disclosed in that patent. The frequency-control part consists of a Master filter (or Master oscillator) 12 followed by the frequency-tuning circuit 14 that similarly to U.S. Pat. No. 3,997,856 may consist of a phase-detector, a low-pass filter and a differential amplifier. These blocks are not drawn separately here for the sake of simplicity. The Q-control part of the scheme consists of the same Master filter (or Master oscillator) 12 followed by the Q-tuning circuit 16. It may consist of an amplitude detection circuit and a differential amplifier. Again, for the sake of simplicity these blocks are not drawn separately here. Since the frequency- and Q-control loops directly control the Master circuit 12 and not the Slave filter 18 due to unavoidable on-chip matching errors the expected accuracy of the M-S frequency scheme could be as low as 5% for frequency-tuning and up to several tens of percent for Q-tuning.

The architecture of a typical filter wafer-probe trimming scheme is illustrated in FIG. 2, and is identified by the numeral 20. It consists of the $g_m$—C oscillator circuit 22 with its output connected to the phase detector 24. The frequency reference is applied to the second input of the phase detector 24. The difference signal at the output of the phase detector 24 is low-pass filtered by filter 26 and applied to the input of a high-gain amplifier that controls $g_m$ of the oscillator circuit 22. During the one-time wafer-probe procedure the oscillation frequency is measured and compared to the frequency reference. The resulting error is used by a negative feedback loop to adjust the $g_m$ of the oscillator, which is built with the same $g_m$—amplifiers as the tuned filter. After the filter $g_m$ amplifiers are adjusted their value becomes fixed, the oscillator and the rest of the trimming circuitry are disabled and the filter $g_m$ amplifiers and its frequency track the temperature by the virtue of its temperature independent biasing. The accuracy of the wafer-probe scheme is expected to be worse than the M-S scheme. The reason is that the wafer-probe scheme demonstrates the M-S accuracy at the beginning, but then after the Master is disabled it relies entirely on the biasing. Since the biasing introduces an extra error by not being able to track the temperature variation perfectly the overall accuracy of the wafer-probe scheme can be as low as 10% for frequency-tuning, which is still useful for some less demanding applications. However, because of the low accuracy, the Q-tuning is not practical using wafer-probe scheme.

The architecture of a proposed self-tuned filter scheme is illustrated in FIG. 3, and is identified by the numeral 30. It consists of two filters 31 and 32. Using switches 33 and 34, when the first of filters 31 and 32 has its input connected to the input signal the other one is tuned and then their roles are interchanged. The outputs of filters 31 and 32 are switched using switches 35 and 36. The frequency reference is applied to the frequency-tuning circuit 39 that generates control signals via hold circuits 37 and 38 for tuning the one of the filters 31 and 32 that is not processing the input signal. The critical difficulty of this scheme is switching the filters on and off the signal such that transients are avoided. As far as accuracy is concerned the proposed self-tuning achieves higher-accuracy than that of M-S scheme. Its tuning accuracy error is related to the overall error of the frequency-tuning scheme, which can as low as 0.5%.

SUMMARY OF THE INVENTION

The present automatic tuning scheme for two BP filters is used in a fully-integrated heterodyne receiver such as one in FIG. 7. Contrary to other tuning schemes both filters operate on the signal while simultaneously being tuned using a reference signal. To allow that the amplitude of reference signal is made small and since both filters demonstrate a good linearity the build-up of the inter-modulation distortion does not occur. For accuracy reasons the first BP is tuned with the reference falling into its pass-band. Under such conditions the reference is not practically attenuated by the first BP filter. However the same distance between the pass-band center and the reference frequency in the second BP filter results in about 40 dB attenuation of the first BP reference. This is because the second BP bandwidth is much narrower than the first BP center bandwidth. At lower IF frequency its order and its Q's can be made sufficiently high to achieve sufficient attenuation. This combined with at least 15 dB the original signal-to-reference ratio results in the desired 55 dB the final signal-to-reference ratio. However, the second band-pass is also tuned. Since there is no further filter in the signal path its tuning reference cannot be removed. To solve this problem the complexity of the second BP is exploited. Assuming the filter passes the signal for positive frequencies if the reference is made a negative frequency by appropriate 90 degrees phase shifting it will be attenuated by at least 55 dB, which is a sufficient signal-to-reference ratio.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
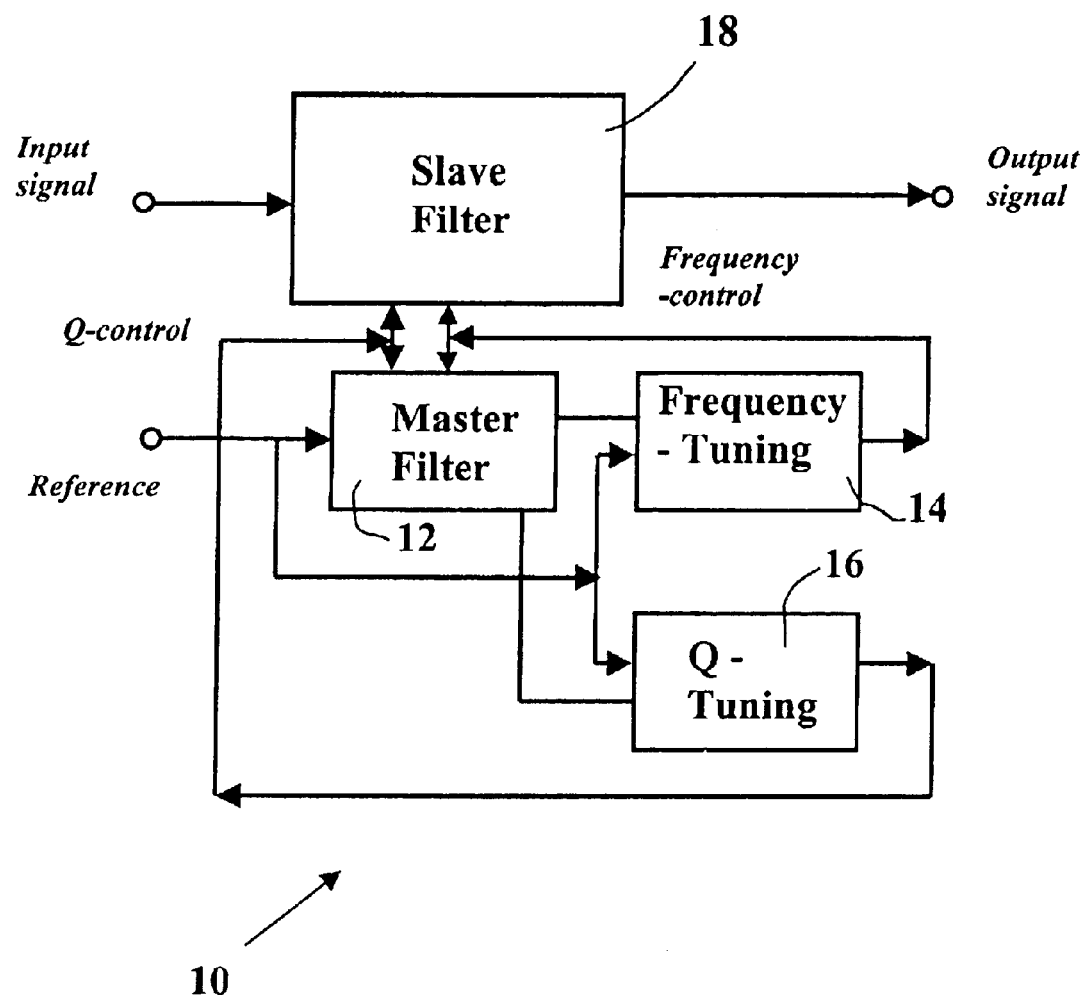
FIGS. 1, 2 and 3 are block diagrams of prior art tuning schemes.
Figure 2:
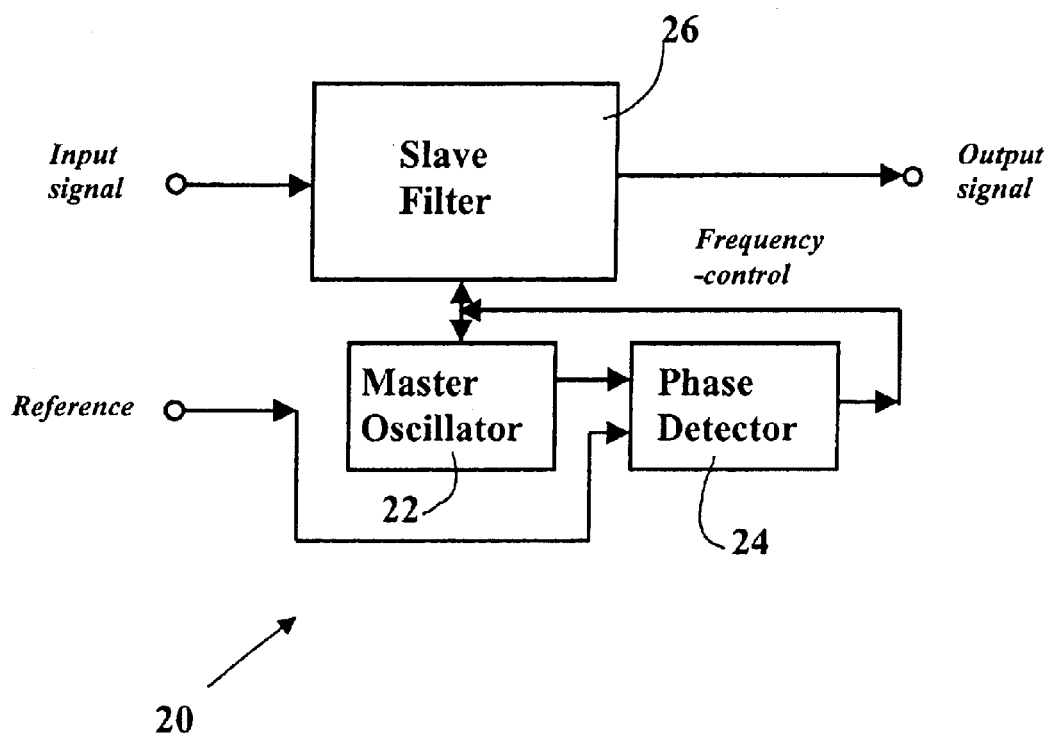
Figure 3:
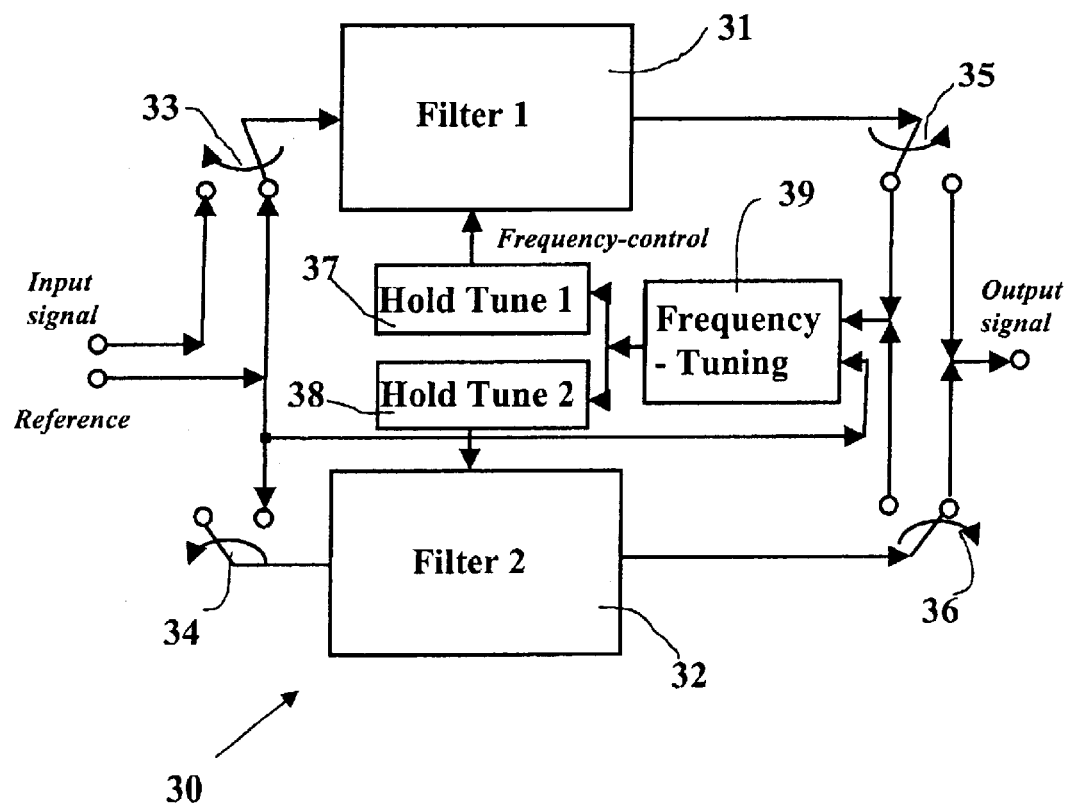
Figure 4:
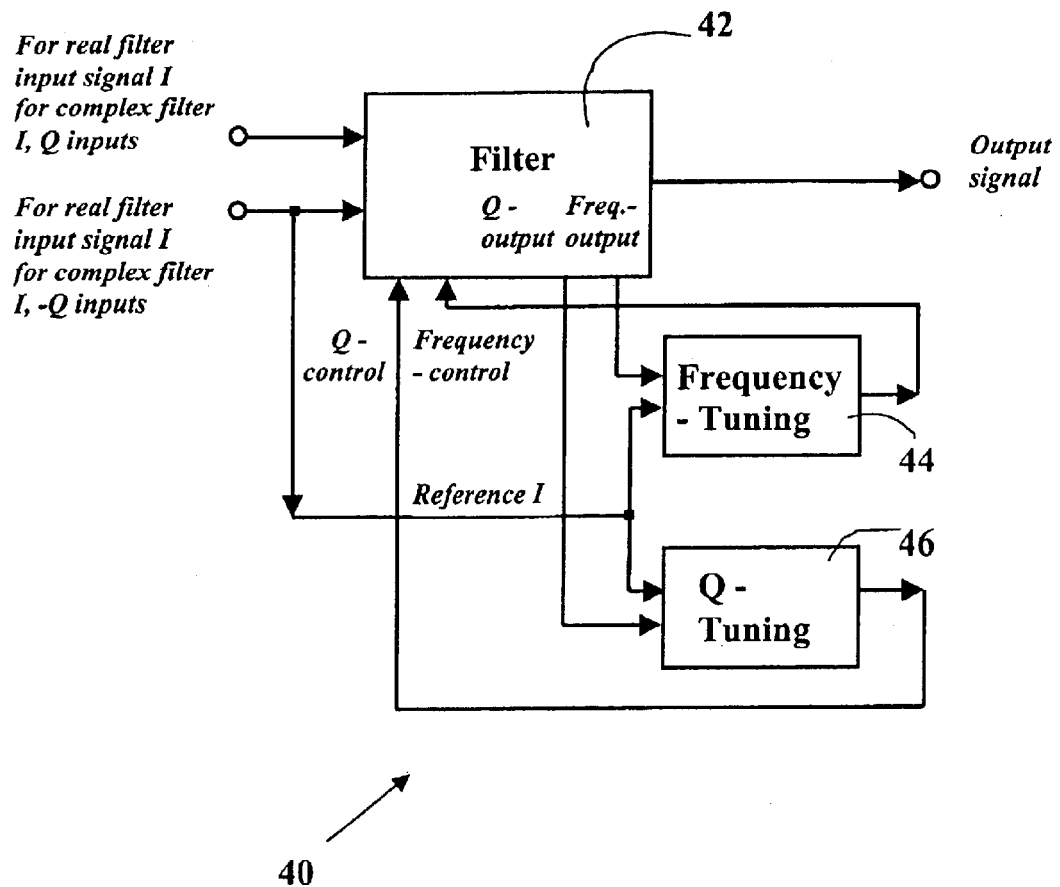
FIG. 4 is a block diagram of the present automatically tuned band-pass filter equipped with frequency- and Q-tuning schemes that operate while the filter is processing the signal.

Referring to the FIG. 4, the present automatically-tuned filter system is illustrated, and is generally identified by the numeral 40. The input signal enters the filter circuit 42, one of the filter outputs is connected to the frequency-tuning block 44 and the other one is connected to the Q-tuning block 46. The output of the frequency-tuning block 44 is then fed back to the filter 42 in order to control its frequency. Similarly, the output of the Q-tuning block 46 is then fed back to the filter 42 in order to control its Q.

The output of the filter 42 may also serve as a frequency- and/or Q-tuning output. In such a case the original frequency- or Q-tuning output(s) is (are) redundant and is (are) not used.

Figure 5A:
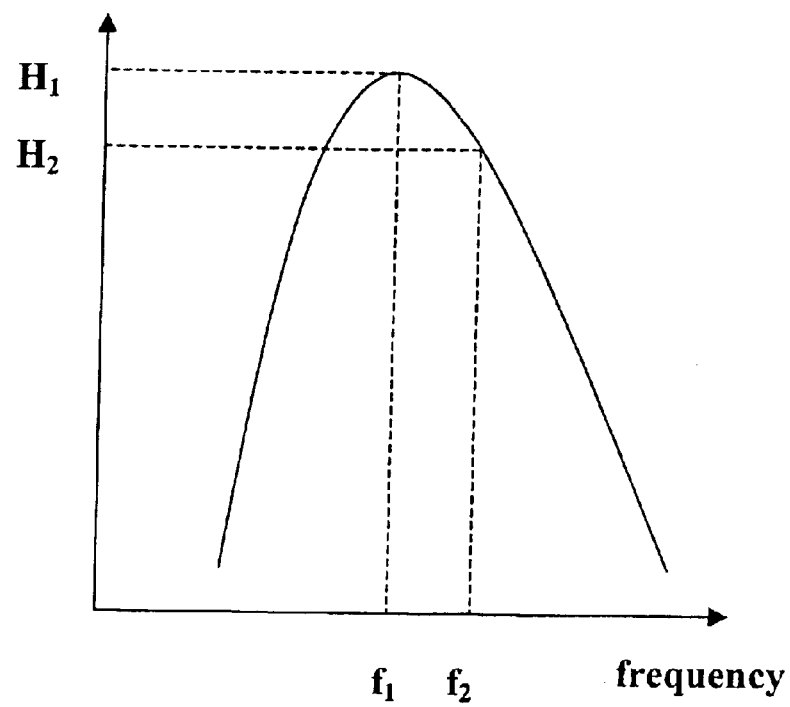
FIGS. 5a and 5b illustrate the attenuation of the signal and the tuning reference of the first BP filter, after passing first BP filter and second BP filter.
Figure 5B:
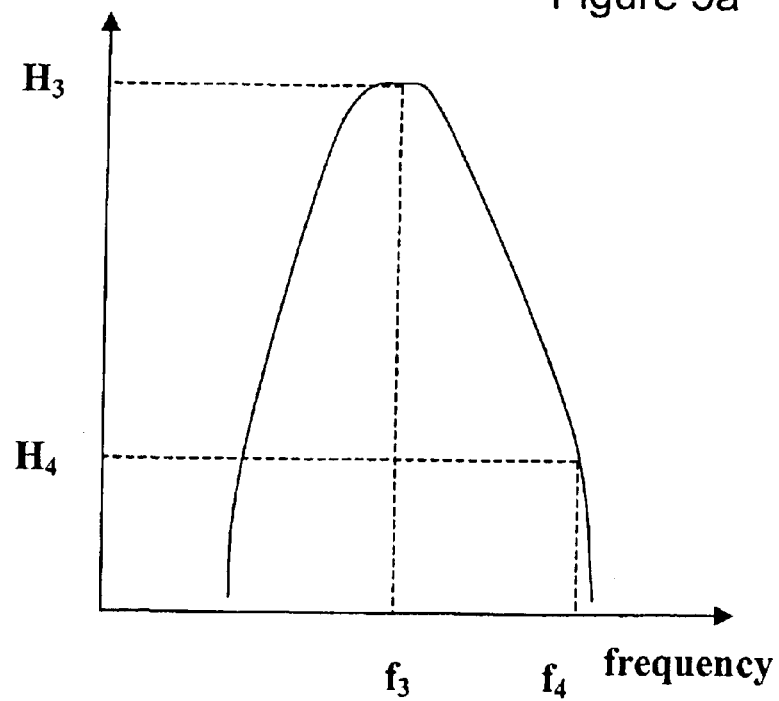
Figure 7:
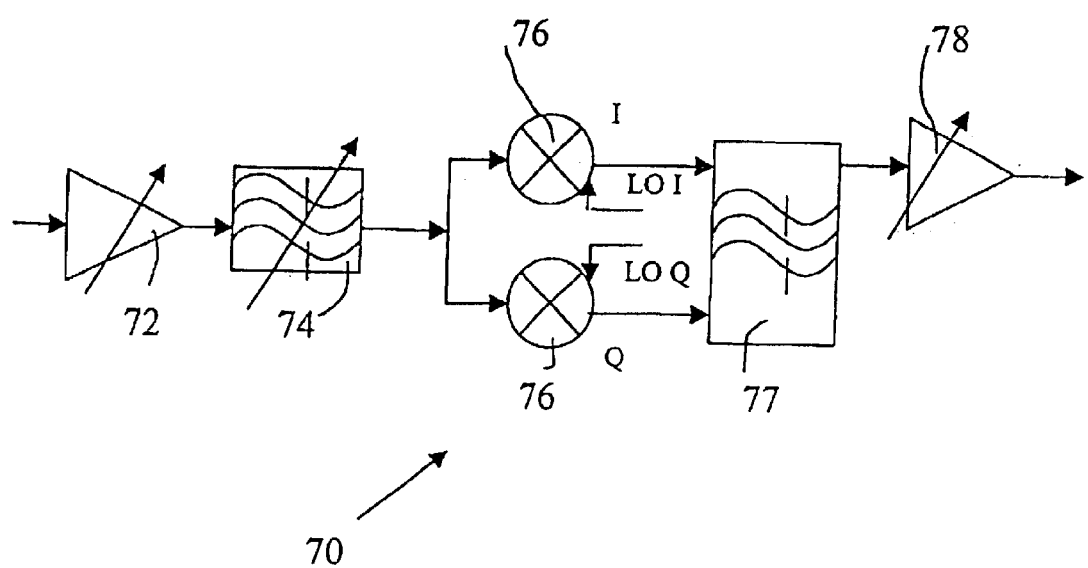
FIG. 7 is a block diagram of the fully integrated heterodyne receiver using the present automatically tuned BP filters.

If the filter circuit 42 is a real band-pass filter such as filter 74 illustrated in FIG. 7 the reference is placed at frequency $f_2$ that is offset from the filter center frequency $f_1$ by $\Delta f = f_2 - f_1$. This situation is illustrated in FIG. 5a. Since the reference passes close to the pass-band its amplitude is kept low to avoid any inter-modulation distortion. The reference is attenuated only by about 1–2 dB by filter 74. However, as shown in FIG. 5b filter 77 (FIG. 7) attenuates the reference by at least 40 dB. This is due to the fact that filter 77 is much narrower than filter 74 and since $\Delta f = f_4 - f_3$ the reference falls into the filter stop-band. Additionally, since the center frequency of filter 77 is much lower than the of filter 74, $f_3 \ll f_1$, it is easier to implement higher Q's and steeper roll-off for filter 77.

If the filter circuit 42 is a complex BP filter, depending on the input signal conditioning, filter 42 passes certain signals and suppresses the others. Assuming the main signal is passed in the form of I and Q components, with Q lagging I by 90 degrees, if the reference is passed in the form of I and -Q components, with Q leading I by 90 degrees, then the filter 42 attenuates the reference by at least 55 dB compared to the main signal.

Figure 6A:
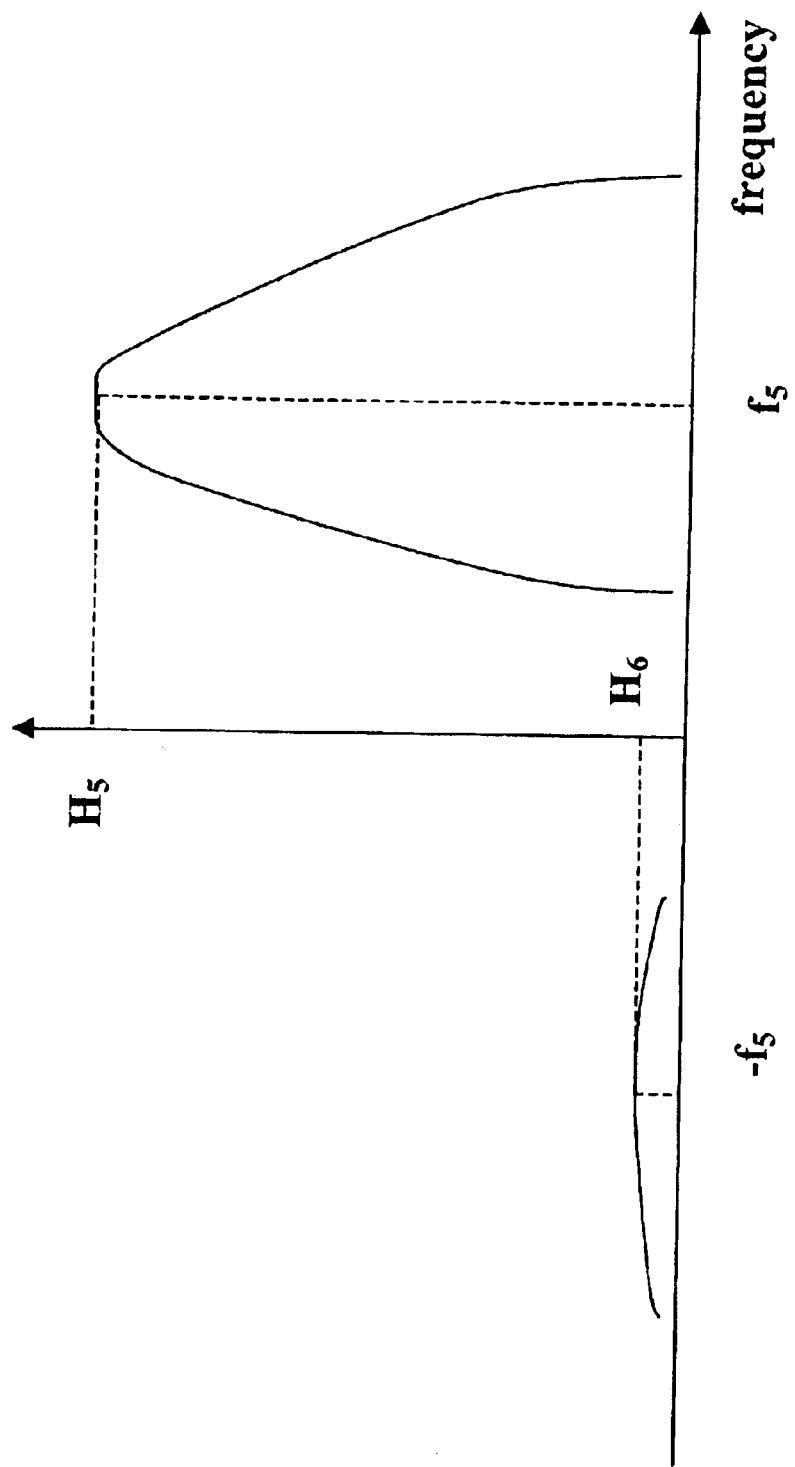
FIG. 6a illustrates the attenuation of complex second BP filter for I, Q signal conditioning: the signal is passed for positive frequencies and blocked for negative frequencies (image rejection)
Figure 6B:
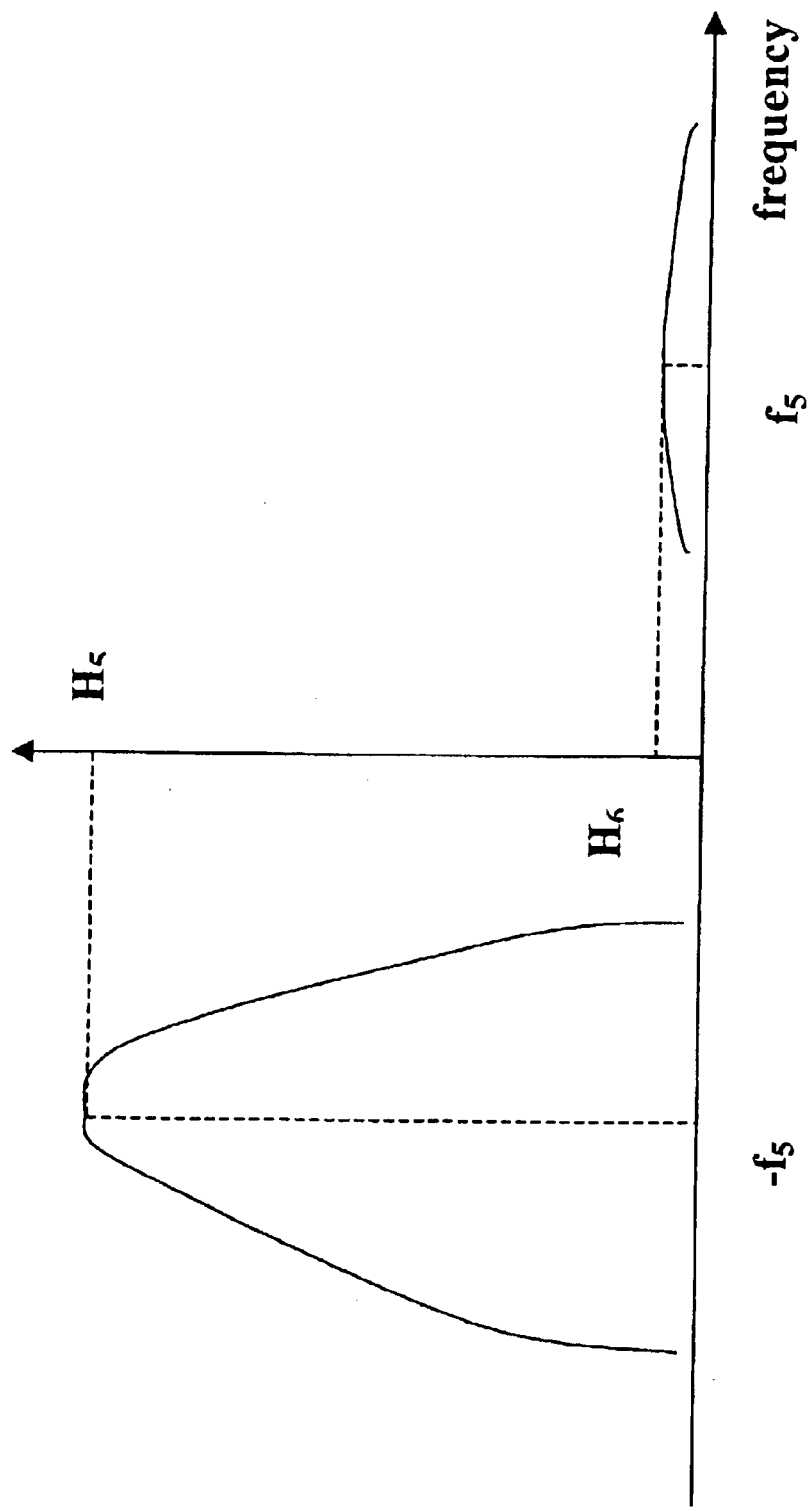
FIG. 6b illustrates the attenuation of complex nature of the second BP filter for I.-Q signal conditioning; the IF BP filter references is passed for negative frequencies and blocked for positive frequencies.

As illustrated in FIG. 6a the main signal characterized by I and Q components is passed by the filter 77 (FIG. 7) for positive frequencies. However, the reference characterized by I and -Q components is suppressed by the filter 77. Naturally, since the reference is I, -Q conditioned, as presented in FIG. 6b, it passes the filter for the negative frequencies, but it is blocked for the positive frequencies such that it does not appear with the main signal.

The filter is directly tuned with reference signal while simultaneously operating on the main signal. By choosing appropriate input amplitude of the reference, the reference output amplitude is set to be sufficiently small to not interfere with the main signal for a given type of signal modulation.

Any viable frequency-tuning technique including, but not limited to phase detection used in phase locked-loop Type I, or phase and frequency detection used in phase locked-loop Type II can be used to implement frequency-tuning circuit 44.

Any viable Q-tuning technique including, but not limited to amplitude detection using rectifiers and envelope-detectors can be used to implement frequency-tuning circuit 46.

The phase, phase/frequency, delay, or amplitude-locked loops used in frequency- and Q-tuning circuits 44 and 46 can be analog, mixed-mode, digital or software.

FIG. 7 illustrates a fully integrated heterodyne receiver 70 using the present filters 74 and 77. The signal from the antenna enters the input of the low-noise amplifier (LNA) circuit 72, the output of which is connected to filter 74. The output of filter 74 is then connected to the two inputs of the complex mixer circuit 76, which consists of two identical mixers fed by identical input signals and two LO signals shifted by 90 degrees (LO I and LO Q). The complex mixer has two outputs I and Q. They enter two inputs of filter 77. The I and Q outputs of filter 77 are connected to the input of the variable gain amplifier (VGA) circuit 78.

I claim:

1. A tuning system for continuous-time filters comprising:
   an active real band-pass filter for receiving an input signal and for generating an output signal in a signal path;
   a first tuning system connected to said active real band-pass filter for receiving an output signal from said active real band-pass filter and for generating a reference signal applied to said active real band-pass filter for tuning said active real band-pass filter while said active real band-pass filter is simultaneously operating on said input signal;
   an active complex band-pass filter connected in said signal path for receiving an input signal on said signal path and for generating an output signal; and
   a second tuning system connected to said active complex band-pass filter for receiving an output signal from said active complex band-pass filter and for generating a reference signal applied to said active complex band-pass filter for tuning said active complex band-pass filter while said active complex band-pass filter is simultaneously operating on said input signal on said signal path.

2. The tuning system of claim 1 wherein said first tuning system includes a frequency-tuning system.

3. The tuning system of claim 1 wherein said first tuning system including a Q-tuning system.

4. The tuning system of claim 1 wherein said second tuning system includes a frequency-tuning system.

5. The tuning system of claim 1 wherein said second tuning system includes a Q-tuning system.

6. The tuning system of claim 1 wherein said filters are fabricated in monolithic technology selected from the group consisting of silicon CMOS, BiCMOS and bipolar processes.

7. The tuning system of claim 1 wherein said real band-pass filter is an on-chip active device, and said complex band-pass filter is an on-chip active device.

8. The tuning system of claim 1 wherein said first tuning system adjusts a center-frequency of said active real band-pass filter with respect to a reference frequency, and said second tuning system adjusts a magnitude, and thereby its Q-factor of said active complex band-pass filter with respect to a reference amplitude.

9. The tuning system of claim 1 wherein said real band-pass filter has a symmetrical frequency response for positive and negative frequencies, and said complex band-pass filter has a non-symmetrical frequency response for positive and negative frequencies.

10. The tuning system of claim 1 wherein said real band-pass filter is tunable by changing its center frequency and its bandwidth, and said complex band-pass filter is tunable by changing its center frequency and its bandwidth.

11. The tuning system of claim 1 wherein said real band-pass filter can be implemented in an active filter design technique selected from the group consisting of Q-enhanced LC design and gm—C design, and said complex band-pass filter can be implemented in an active filter design technique selected from the group consisting of an active R—C design, MOSFET—C design, and gm—C design.

12. The tuning system of claim 1 wherein, said real band-pass filter is tuned with said reference signal falling in said real band-pass filter pass-band.

13. The tuning system of claim 1 wherein, said complex band-pass filter is tuned with said reference signal falling in said complex band-pass filter pass-band.

* * * * *

UNITED STATES PATENT AND TRADEMARK OFFICE
CERTIFICATE OF CORRECTION

PATENT NO. : 6,917,252 B1
APPLICATION NO. : 10/423923
DATED : July 12, 2005
INVENTOR(S) : Adam S. Wyszynski It is certified that error appears in the above-identified patent and that said Letters Patent is hereby corrected as shown below:

<u>Column 1</u>

Line 67 delete "with" and

Insert -- without --.

<u>Column 3</u>

Line 30 delete "center"

Signed and Sealed this

First Day of January, 2008

JON W. DUDAS
*Director of the United States Patent and Trademark Office*